(12) United States Patent
Savas

(10) Patent No.: US 6,253,704 B1
(45) Date of Patent: *Jul. 3, 2001

(54) APPARATUS AND METHOD FOR PULSED PLASMA PROCESSING OF A SEMICONDUCTOR SUBSTRATE

(75) Inventor: Stephen E. Savas, Alameda, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/398,553

(22) Filed: Sep. 17, 1999

Related U.S. Application Data

(63) Continuation of application No. 08/727,209, filed on Oct. 8, 1996, now Pat. No. 5,983,828.
(60) Provisional application No. 60/055,288, filed on Oct. 13, 1995.

(51) Int. Cl.⁷ .............................. C23C 16/00; H05H 1/00
(52) U.S. Cl. ........................................ 118/723 I; 156/345
(58) Field of Search .................... 118/723 I, 723 AN; 156/345; 315/111.51, 111.21

(56) References Cited

U.S. PATENT DOCUMENTS

| | | | |
|---|---|---|---|
| 4,749,589 | * 6/1988 | Heinecke et al. | 427/39 |
| 4,824,690 | * 4/1989 | Heinecke et al. | 427/38 |
| 4,935,661 | * 6/1990 | Heinecke et al. | 313/231.31 |
| 5,983,828 | * 11/1999 | Savas | 118/723 I |
| 6,068,784 | * 5/2000 | Collins et al. | 118/723 I |

FOREIGN PATENT DOCUMENTS

| | | | |
|---|---|---|---|
| 0154482A2 | * 11/1985 | (EP) | C23C/16/00 |
| 2240114A | * 7/1991 | (GB) | C23C/16/26 |
| 408288272 | * 11/1996 | (JP) | C23C/16/50 |

\* cited by examiner

*Primary Examiner*—Gregory Mills
*Assistant Examiner*—P. Hassanzadeh
(74) *Attorney, Agent, or Firm*—Wilson Sonsini Goodrich & Rosati; Michael J. Murphy

(57) ABSTRACT

Apparatus and method for an improved etch process. A power source alternates between high and low power cycles to produce and sustain a plasma discharge. Preferably, the high power cycles couple sufficient power into the plasma to produce a high density of ions ($\geq 10^{11} cm^{-3}$) for etching. Preferably, the low power cycles allow electrons to cool off to reduce the average random (thermal) electron velocity in the plasma. Preferably, the low power cycle is limited in duration as necessary to prevent excessive plasma loss to the walls or due to recombination of negative and positive ions. It is an advantage of these and other aspects of the present invention that average electron thermal velocity is reduced, so fewer electrons overcome the plasma sheath and accumulate on substrate or mask layer surfaces. A separate power source alternates between high and low power cycles to accelerate ions toward the substrate being etched. In one embodiment, a strong bias is applied to the substrate in short bursts. Preferably, multiple burst occur during the average transit time for an ion to cross the plasma sheath and reach the substrate surface. Ions are pulsed toward the surface for etching. These ions are not deflected into sidewalls as readily as ions in conventional low energy etch processes due to reduced charge buildup and the relatively low duty cycle of power used to pulse ions toward the substrate surface.

26 Claims, 8 Drawing Sheets

APPARATUS AND METHOD FOR PULSED PLASMA PROCESSING OF A SEMICONDUCTOR SUBSTRATE

BACKGROUND OF THE INVENTION

1. Reference to Related Application

This Appln is a Con't of Ser. No. 08/727,209 filed Oct. 8, 1996, U.S. Pat. No. 5,983,828 and claims priority from provisional application Ser. No. 60/005,288 filed Oct. 13, 1995. Provisional application Ser. No. 60/005,288 is hereby incorporated herein by reference in its entirety.

2. Field of the Invention

The field of the invention relates generally to semiconductor processing. More particularly, the field of the invention relates to an apparatus and method for pulsed plasma etching of a semiconductor substrate.

3. Description of the Related Art

Plasmas have been used in a variety of processes for the manufacture of integrated circuit devices including etching, stripping of photoresist and plasma enhanced chemical vapor deposition. The plasma is created by providing energy to a gas in a reactor chamber. The plasma consists of two qualitatively different regions: a quasi-neutral, equipotential conductive plasma body and a boundary layer called the plasma sheath. The plasma body comprises a plurality of mobile charge carriers and thus is a conductive medium. Its interior generally has a uniform electric potential. A plasma cannot exist for long in direct contact with material objects and rapidly separates itself from objects by forming a non-neutral sheath. The sheath is an electron deficient, poorly conductive region having a strong electric field. This electric field typically extends perpendicularly between the plasma body and any interface with material objects, such as reactor walls and wafers placed within the reactor.

Plasma reactors typically provide energy to the gas in the reactor chamber by coupling RF electric power into the chamber. The RF power coupled into the reactor chamber ionizes, dissociates, and excites molecules within the plasma body. In particular, the RF power provides energy to free electrons in the plasma body. Ionization occurs when an energized free electron collides with a gas molecule causing the gas molecule to ionize. Dissociation occurs when an energized free electron collides with a gas molecule, such as $O_2$, causing the molecule to break into smaller molecular or atomic fragments, such as atomic oxygen, for example. Excitation occurs when the collision does not break molecular bonds but rather transfers energy to the molecule causing it to enter an excited state. Control of the relative amounts of ionization, dissociation, and excitation depends upon a variety of factors, including the pressure and power density of the plasma. The plasma body typically consists of radicals, stable neutral particles and substantially equal densities of negatively and positively charged particles.

Plasmas may be particularly useful for anisotropic etching of a semiconductor substrate. Anisotropic etching is etching that occurs primarily in one direction, whereas isotropic etching is etching that occurs in multiple directions. Anisotropic etching is desirable for manufacturing integrated circuit devices, because it can be used to produce integrated circuit features having precisely located sidewalls that extend substantially perpendicularly from the edges of a masking layer. This precision is important in devices that have a feature size and spacing comparable to the depth of the etch.

To accomplish an anisotropic plasma etch, a semiconductor substrate such as a wafer may be placed in a plasma reactor such that the plasma sheath forms an electric field perpendicular to the substrate surface. This electric field accelerates ions perpendicularly toward the substrate surface for etching. One conventional approach to anisotropic plasma etching uses parallel planar electrodes. Often, the lower electrode acts as a pedestal for a wafer. RF power is applied to the electrodes to produce a plasma and accelerate ions toward the wafer surface.

The crystalline silicon or thin insulating layers of some modern integrated circuit designs may be damaged by high energy ion bombardment, so it may be necessary to decrease the RF power applied to the electrodes for lower ion energy etch processes. Decreasing the RF power, however, will reduce the ion density in the plasma. Decreased ion density usually decreases the etch rate.

Inductively coupled reactors have been used to overcome this problem by using separate RF coupling mechanisms (and therefore separate power sources) to control the ion density and ion bombardment energy. Power is applied to an induction coil surrounding the reactor chamber to inductively couple power into the chamber to produce the plasma. The inductively coupled power accelerates electrons circumferentially within the plasma and generally does not accelerate charged particles toward the wafer which is placed below the plasma. The level of power applied to the induction coil may be adjusted to control the ion density in the plasma. Some power from the induction coil may be capacitively coupled into the plasma, however, and may accelerate ions toward the walls and the wafer. To reduce this; capacitive coupling a split Faraday shield may be placed around the reactor. See U.S. patent application Ser. No. 07/460,707 filed Jan. 4, 1990, which is assigned of record to the assignee of the present application and which is hereby incorporated by reference. A separate source of power may be applied to a wafer support to accelerate ions toward the wafer for etching. A relatively high level of power may be applied to the induction coil to provide a plasma with a high ion density, and a relatively low level of power may be applied to the wafer support to control the energy of ions bombarding the wafer surface. As a result, a relatively high rate of etching may be achieved with relatively low energy ion bombardment.

While low energy ion bombardment may reduce damage to sensitive layers of the integrated circuit, other problems may be encountered which interfere with the anisotropic nature of the etch. In particular, low energy ions may be deflected by charges that accumulate on the wafer or mask surface during etching.

This charge buildup may result from the relatively isotropic motion of electrons in the plasma as opposed to the anisotropic motion of the ions. The normal thermal energy of the plasma causes the electrons to have high velocities because of their low mass. These high velocity electrons collide with molecules and ions and may be deflected in a variety of directions, including toward the wafer surface. While the negative bias on the wafer tends to repel electrons, the high velocity of some electrons overcomes this negative bias. The electrons are deflected in a variety of directions and have a relatively isotropic motion. As a result, electrons deflected toward the wafer surface tend to accumulate on elevated surfaces of the wafer or mask layer, rather than penetrating to the depths of narrow wafer features (which would require a perpendicular, anisotropic motion).

Ions, on the other hand, have a large mass relative to electrons and do not have high random velocities. Rather, the bias on the wafer support accelerates ions perpendicularly toward the wafer surface. This anisotropic acceleration allows ions to penetrate to the depth!; of narrow wafer features more readily than electrons.

As a result, negatively charged electrons tend to accumulate on the upper surfaces of the wafer or mask layer, while positively charged ions tend to accumulate in the recessed regions of the wafer that are being etched. These accumulated charges may form small electric fields, referred to as "micro fields," near integrated circuit features on the wafer surface. While these small electric fields may have little effect on high energy ions, they may deflect low energy ions used in low energy etch processes for small integrated circuit feature!;. The negative charge on the substrate or mask surface tends to attract positively charged ions, while the positive charge in recessed regions tends to repel these ions. As a result, low energy ions falling into recessed regions between features may be deflected into feature sidewalls, thereby undercutting the mask layer. This undercutting can degrade the anisotropic etch process and inhibit the formation of well-defined features with vertical sidewalls.

Therefore, what is needed is an improved anisotropic etch process. Preferably such a process will allow low energy ions to be used for etching small integrated circuit features while substantially eliminating the problems associated with charge buildup on the wafer surface. Preferably such a process will enable the manufacture of small integrated circuit features with well-defined vertical sidewalls.

SUMMARY

Aspects of the present invention provide an improved etch process. One aspect of the Is present invention provides a power source that alternates between high and low power cycles to produce and sustain a plasma discharge. Preferably, the high power cycles couple sufficient power into the plasma to produce a high density of ions ($\geq 10^{11}$cm$^-$3) for etching. Preferably, the low power cycles allow electrons to cool off to reduce the average random (thermal) electron velocity in the plasma. Preferably, the low power cycle is limited in duration as necessary to prevent excessive plasma loss to the walls or due to recombination of negative and positive ions. During the low power cycles the power may be off It is an advantage of these and other aspects of the present invention that average electron thermal velocity is reduced, so fewer electrons overcome the plasma sheath and accumulate on substrate or mask layer surfaces. As the plasma electrons cool, the sheath potential decreases which allows the plasma to move closer to the substrate surface and positive ions flow to the wafer surface which neutralizes charges that have accumulated on elevated surfaces as well as within the depths of recessed features.

Another aspect of the present invention provides a separate power source that alternates between high and low power cycles to accelerate ions toward the substrate being etched. In one embodiment, a strong bias is applied to the substrate in short bursts. Preferably, multiple bursts occur during the average transit time for an ion to cross the plasma sheath and reach the substrate surface. During the low power cycles, the power may be off.

When intermittent bursts are used for the bias, ions are accelerated toward the substrate in pulsed waves. Ions striking the surface cause anisotropic etching of the substrate. Most ions are pulsed near the substrate surface without reaching it. During the low power cycles, these ions coast toward the surface and those that do not collide with neutral particles continue to move substantially perpendicularly to the biased surface. During the next burst, the remaining ions in the sheath are again accelerated toward the substrate for anisotropic etching. These ions are not deflected into sidewalls as readily as ions in conventional low energy etch processes due to reduced charge buildup and the relatively low duty cycle of power used to pulse ions toward the substrate surface.

In an alternate embodiment, a lower frequency A.C. bias (100 kHz to 1 MHz) is applied to the substrate. The bias may be a continuous A.C. wave or it may alternate between high power cycles (for multiple wavelengths) and low (or zero) power cycles. Preferably, the half cycles of the A.C. waveform are at least equal to the ion transit time for ions in the sheath region. When a low frequency A.C. bias is used, negative and positive ions are alternatively accelerated toward the substrate for etching. Since the etch alternates between negative and positive ions, charge buildup on the substrate surface is avoided.

Preferably, the above aspects of the present invention are combined into a single low ion energy, anisotropic etch process with reduced charge buildup and improved feature definition.

DETAILED DESCRIPTION

Figure 1:
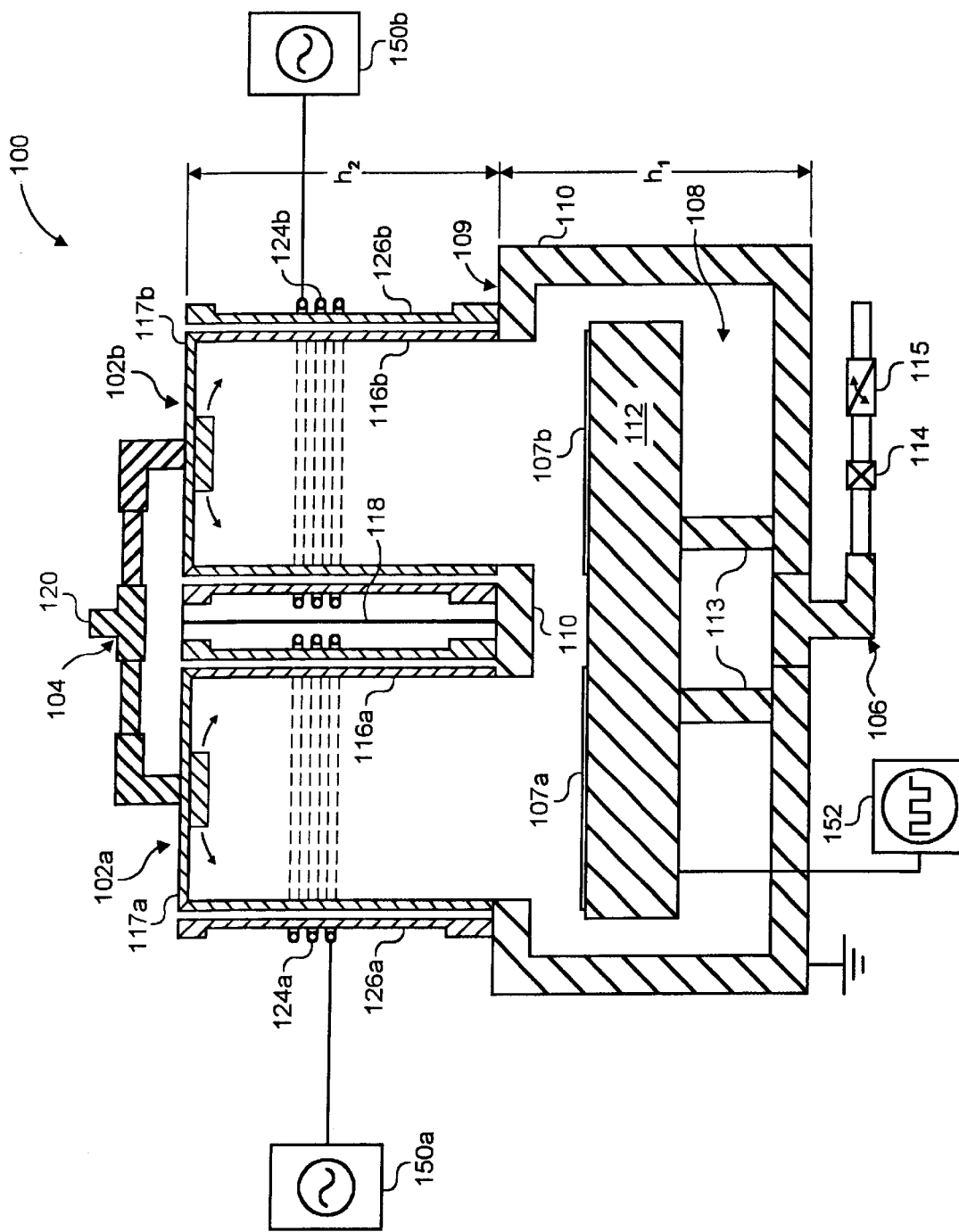
FIG. 1 illustrates a wafer processing system according to a first embodiment of the present invention.

Aspects of the present invention provide a novel apparatus and method for processing semiconductor substrates. The following description is presented to enable a person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the described or illustrated embodiments, but should be accorded the widest scope consistent with the principles and features disclosed herein.

In one embodiment of the present invention, two power sources are used for anisotropic plasma etching. A first power source is used to produce a stable plasma discharge with a desired ion density. The first power source is preferably applied to an induction coil which inductively couples power into the plasma. The second power source is used to bias the substrate being etched. Preferably, the substrate is positioned below the plasma region substantially parallel to the direction of the induction electric field produced by the induction coil. The second power source may be applied to a planar electrode that acts as a support for the wafer.

In this embodiment, the inductively coupled power alternates between high and low power cycles to produce and sustain a plasma discharge. The high power cycles couple sufficient power into the plasma to produce a high density of ions for etching. The low power cycles allow electrons to cool off to reduce the average electron thermal velocity in the plasma. Typically, the low power cycle is longer than the high power cycle and the plasma exists primarily in the "after glow" state. The duration of the low power cycle is limited, however, so electrons and ions do not recombine or fall to walls in such large numbers that the ion density is insufficient for the desired etch rate, or makes the plasma hard to reignite.

The low power cycles reduce the average electron thermal velocity in the plasma, so fewer electrons overcome the plasma sheath and accumulate on substrate or mask layer surfaces. As the plasma cools, the sheath potential and width decrease which causes the plasma to approach closer to the substrate surface and reduces the voltage to which electron charges accumulate on elevated (resist-covered) surfaces. Thus, alternating the inductively coupled power reduces the charge buildup on substrate surfaces, as it reduces the floating potential.

In one embodiment, the bias on the substrate also alternates between high and low power cycles to accelerate ions toward the substrate for anisotropic etching. A strong bias is applied to the substrate in short bursts. Preferably, multiple bursts occur during the average transit time for an ion to cross the plasma sheath and reach the substrate surface. The amplitude of the bursts is typically greater than the amplitude of continuous RF biases used in conventional low energy etch processes.

The alternating bias accelerates ions toward the substrate during pulses only. During high power bursts, ions accelerate toward the substrate. Most ions are accelerated toward the substrate surface without reaching it. During the low power cycles, these ions retain their anisotropic motion and those that strike elevated surfaces help to neutralize them. During the next burst, the remaining ions near the substrate surface are again accelerated toward the substrate for anisotropic etching. These ions, when they finally strike the surface, are not deflected into sidewalls as readily as ions in conventional low energy etch processes due to reduced charge buildup and the low duty cycle of power used to pulse ions toward the substrate surface.

In an alternate embodiment, a lower frequency A.C. bias (100 kHz to 1 MHz) is applied to the substrate. The bias may be a continuous A.C. wave or it may alternate between high power cycles (for multiple wavelengths) and low (or zero) power cycles. Preferably, the half cycles of the A.C. waveform are at least equal to the ion transit time for ions in the sheath region. When a low frequency A.C. bias is used, negative and positive ions are alternatively accelerated toward the substrate for etching. Since the etch alternates between negative and positive ions, charge buildup on the substrate surface is avoided.

The pulsed plasma discharge and pulsed or low frequency A.C. substrate bias combine to provide a low ion energy, anisotropic etch process with reduced charge buildup and improved feature definition.

FIG. 1 illustrates a side cross-sectional view of an inductively coupled plasma reactor system 100 according to a first embodiment of the present invention. The system is used for etching semiconductor substrates such as wafers or the like to form small integrated surface features with well-defined sidewalls. In particular, the system may be used to anisotropically etch small integrated circuit features that have a width on the order of or less than the depth of the etch. The system 100 uses two cylindrical plasma generation chambers 102a and 102b side by side. Similar components are used in each of the plasma generation chambers 102a and 102b. These components are identified using the same reference numeral for each chamber, except that the suffixes "a" and "b" have been added to differentiate between components for generation chamber 102a and 102b, respectively. The elements of this embodiment may also be referred to generally by their reference numeral without any appended suffix. As shown in FIG. 1, the two generation chambers use substantially duplicate elements and operate substantially independently. They do, however, share a gas supply system 104, an exhaust system 106 and a substrate processing chamber 108. The system 100 allows concurrent processing of two wafers which doubles throughput. In particular, the system 100 is configured for use in conjunction with the Aspen™ wafer handling system from Mattson Technology, Inc. Of course, it will be readily apparent that aspects of the present invention may be used in any variety of plasma processing systems including systems with single or multiple plasma generation chambers.

System 100 allows ion bombardment energies to be controlled substantially independently of the ion current density. Induction coils 124 encircle the plasma generation chambers 102. These induction coils are connected to first power sources 150. A separate electrode 112 acts as a substrate support adjacent to which semiconductor wafers 107 are placed for processing. While a single electrode 112 is used for both wafers 107a and 107b, separate electrodes may be used for each wafer. Electrode 112 is coupled to a second power source 152. The power applied to electrode 112 is used to control ion bombardment energies, while the power applied to induction coils 124 is used to control ion current density.

As described above, problems associated with charge buildup are avoided by using high and low power cycles on the induction coil 124 and the electrode 112. In an exemplary configuration, the first power source applies RF power to the induction coil 124 during high power cycles and applies no power during low power cycles. RF power at 13.56 MHz is typically used, although other frequencies may be used as well. The high power cycles typically last anywhere from 5 to 100 microseconds and the low power cycles typically last from 30 to 1000 microseconds. The duration of the high power cycles is typically less than or equal to the duration of the low power cycles. The duty cycle of the high power cycles is typically greater than or equal to 10%. The above configuration is exemplary. What is desired is a high power cycle that sustains a plasma discharge with sufficient ion density for the desired etch rate, and a low power cycle that allows electrons to cool without reducing the ion density below the level required for etching and without making it difficult to sustain the plasma discharge with the next high power cycle.

In the exemplary configuration, the second power source applies a strong negative voltage pulse to the electrode during high power cycles and applies little or no voltage during low power cycles. During the high power cycles, the second power source applies a negative bias of from 20 to 500 volts on the electrode. A single square, triangular or sinusoidal pulse may be used to provide the bias during each high power cycle. The duration and frequency oil the pulses are typically selected such that several pulses occur during the average transit time for an ion to cross the plasma sheath and reach the substrate surface. These pulses cause the substrate to be etched by ions which are mainly "coasting" to the surface. The duration of the pulses typically range from 1% to 10% of the average ion transit time with typical values in the range of from about 0.02 to 0.2 microseconds. The frequency of the pulses typically ranges from 500 kHz to 60 MHz. The above configuration is exemplary. What is desired is an intermittent bias on the substrate that alternates between ion acceleration cycles that accelerate ions toward the substrate for anisotropic etching and charge neutralization cycles that neutralize or remove charges that have accumulated on the substrate surface.

In an alternate embodiment, a lower frequency A.C. bias (100 kHz to 1 MHz) is applied to the substrate. The bias may be a continuous A.C. wave or it may alternate between high power cycles (for multiple wavelengths) and low (or zero) power cycles. Preferably, the half cycles of the A.C. waveform are at least equal to the ion transit time for ions in the sheath region. When a low frequency A.C. bias is used, negative and positive ions are alternatively accelerated toward the substrate for etching. Since the etch alternates between negative and positive ions, charge buildup on the substrate surface is avoided.

Figure 2:
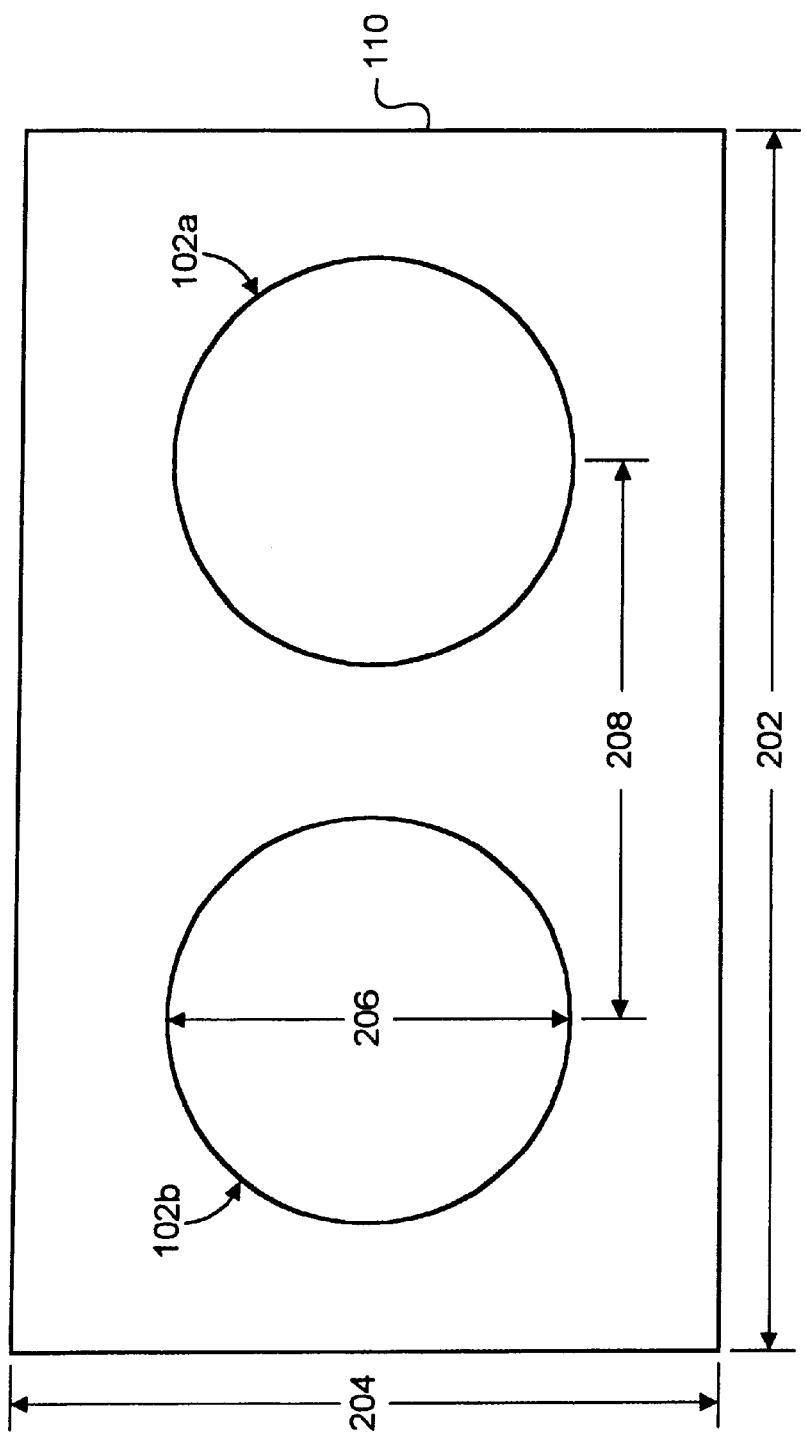
FIG. 2 is a simplified top plan view of the wafer processing system according to the first embodiment.

The structure and operation of the substrate processing system 100 according to the first embodiment of the present invention will now be described in detail. In the present embodiment, two semiconductor substrates such as wafers 107 may be placed in a processing chamber 108 for etching. The processing chamber 108 is rectangular, and has a height, h1, of approximately 25 cm. FIG. 2 shows a simplified top plan view of the reactor system according to this embodiment Referring to FIG. 2, the width 202 of the processing chamber is approximately 60 cm. The depth 204 of the processing chamber measured from the outside of processing chamber wall 110 is approximately 35 cm. The plasma generation chambers 102a and 102b are positioned above the processing chamber and have an outer diameter 206 of approximately 30 cm for 8 inch wafers (40–45 cm for 12 inch wafers). The plasma generation chambers are separated by a distance 208 of approximately 28 centimeters from center to center for 8 inch wafers.

Referring to FIG. 1, the processing chamber wall 110 is grounded. The processing chamber wall 110 provides a common ground for the system and comprises a conductive material such as aluminum or the like. Within the processing chamber is a powered electrode 112 that acts as a support for wafers 107 or other substrate to be processed. This electrode 112 may also be made in part of aluminum. The electrode is supported by a ceramic support 113.

As shown in FIG. 1, below ceramic support 113 is a gas exhaust system 106. The gas exhaust system 106 may be driven by a conventional fan, pump or similar device. The exhaust system 106 has a throttle valve 115 for regulating the gas flow in the exhaust system 106. A shut off valve 114 is also provided.

The top surface 109 of processing chamber 108 is approximately 3–5 cm above the surface of wafers 107. The plasma generation chambers have a height, h2, of approximately 15–25 cm and, as shown in FIG. 2, have an outer diameter 206 of approximately 30–45 cm. Referring to FIG. 1, the plasma generation chamber walls 116 are made of a nonconductive material such as quartz or alumina and have a thickness of approximately 4 to 6 millimeters. The plasma generation chambers are covered by lids 117. The generation chambers 102a and 102b are separated by a partition 118 comprising a thin (approximately 1/16 inch thick) sheet of aluminum. The partition may be an integral part of a safety cage that encloses the generation chambers and the induction coils to prevent radiation from entering the surrounding environment. For purposes of clarity, the safety cage is not shown in FIG. 1.

A gas supply system 104 is provided above the plasma generation chambers 102. In the center of each chamber is an input pipe 120 that provides gases (such as oxygen, $SF_6$, $CHFCl_2$, argon or the like) to the plasma reactor chambers. The gas supply system 104 and the gas exhaust system 106 cooperate to maintain a gas flow and pressure in the generation chambers that promotes ionization given the strength of the induction electric field. For a $SF_6$/Ar gas based process (i.e., silicon etch), pressures in the range of 5–20 millitorr are used, with 7–10 millitorr being preferred. In the first embodiment, $SF_6$ gas is provided to each generation chamber at between approximately 10 to 50 standard cubic centimeters per minute, with 30 standard cubic centimeters per minute being typical. In addition, about 100 to 200 standard cubic centimeters of argon are provided to each generation chamber. The pressure in each chamber is maintained at less than about 30 millitorr with a pressure in the range of about 7–10 millitorr being typical. It is believed, however, that total flow rates from 50 standard cubic centimeters per minute up to 300 standard cubic centimeters per minute may be used effectively in this embodiment.

The induction coils are connected to first power sources 150 through conventional impedance match networks (not shown). In the present embodiment, the induction coils 124a and 124b each have three turns. The induction coils 124a and 124b may have a conductor diameter of approximately 1/4 inch, and be separated turn-to-turn by about 3/8 to 5/8 of an inch from center to center. The diameter from the center of each coil on one side of a plasma generation chamber to the center of the coil on the other side of the plasma generation chamber is approximately 13 inches for 8 inch wafers (about 15 inches for 12 inch wafers). In this embodiment, the center of the middle turn of the induction coil is approximately 8 cm from the top of the plasma reactor chamber for 8 inch wafers; (about 12 cm for 12 inch wafers) and approximately 3–5 cm from the top of the processing chamber 108. This allows a plasma to be generated and substantially confined near the surface of the wafers 107. The center of this middle turn is positioned approximately 12 centimeter from the wafer surface for 8 inch wafers (about 16 cm for 12 inch wafers).

In the first embodiment, the induction coils couple energy into the plasma generation chambers 102 during high power cycles to produce a plasma. During high power cycles the induction coils produce a circumferential electric field in the plasma generation chambers that is substantially parallel to the wafer surfaces. The electric field produces a plasma in the plasma generation chambers. The density of the plasma reaches a peak in the center of an annular toroid. During low power cycles for the induction coils, the plasma sheath collapses and the plasma expands coming closer to the chamber walls and wafer surfaces.

Figure 3:
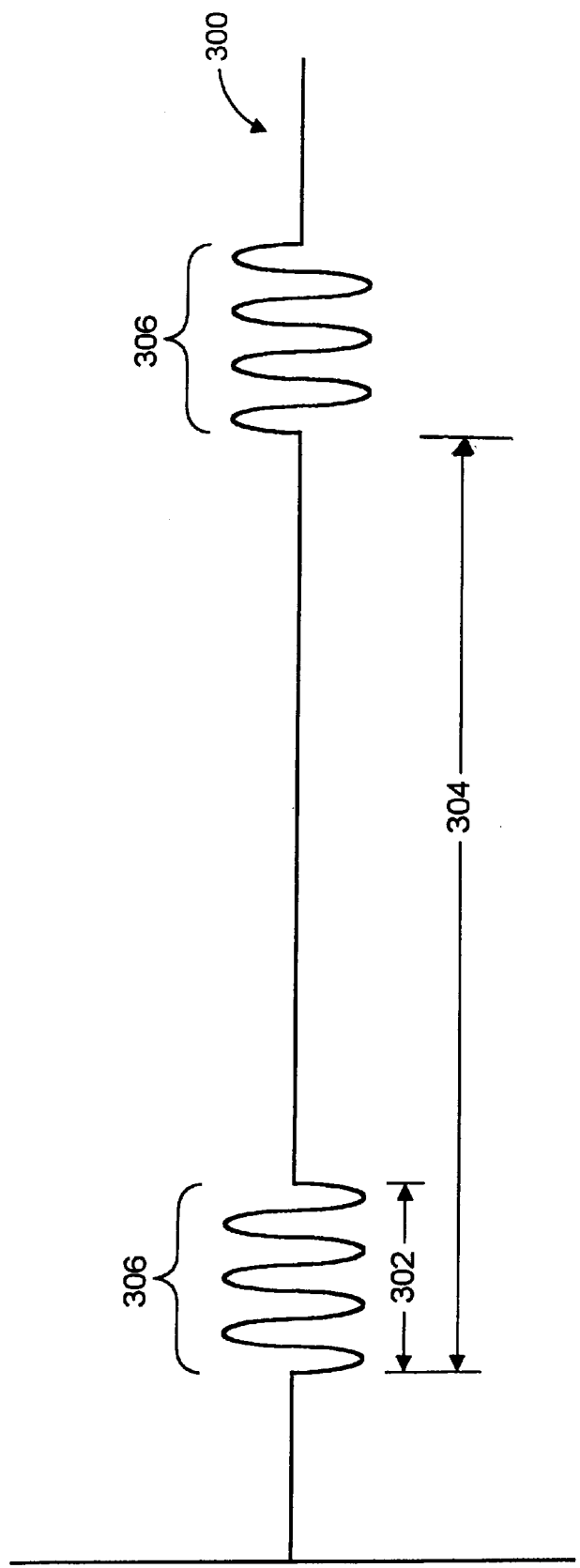
FIG. 3 shows an exemplary power signal that may be applied to an induction coil in the wafer processing system according to the first embodiment.

The power applied to the induction coils 124 is pulsed with a small duty cycle to reduce charge buildup on wafer surfaces (which may include mask layers). FIG. 3 shows an exemplary power signal waveform 300 that may be applied to the induction coils in the system of the first embodiment.

This power signal couples sufficient power into the plasma to build up and maintain a desired ion density, while allowing free electrons a "settling" period during which they can cool. This pulsing technique produces a plasma with much lower average electron thermal energies than would be possible with a non-pulsed (e.g. a continuous RF) signal of the same amplitude. The lower average electron energies reduce the number of excess electrons that can overcome the plasma sheath voltage and accumulate thereby charging up wafer surfaces. As the plasma cools, the sheath potential decreases which allows the plasma to expand closer to the wafer surface thus better neutralizing accumulated charge.

Referring to FIG. 3, the high power cycles 306 comprise a series of RF pulses. In the present embodiment, RF power at 13.56 MHz is used during the high power cycles 306, although it is believed that frequencies from 2 kHz to 40.68 MHz can be used effectively in system 100. The induction coils 124 couple power into the plasma during the high power cycles 306. The remaining portion of each period comprises a low power cycle that does not couple significant power into the plasma. Of course, a low power RF signal may be applied during the low power cycles. The low power cycle should provide no more than several times less power to the plasma than the high power cycle, preferably at least 10 to 100 times less. During low power cycles the average electron thermal velocity decreases. Preferably the high power cycles are substantially shorter than the low power cycles as reflected in the duty cycle of waveform 300. The duty cycle of waveform 300 is the period of the high frequency cycle 302 divided by the total period 304. The present embodiment has a duty cycle of about 10 percent. It is believed, however, that duty cycles ranging from about 5 percent to 30 percent may be used effectively in the first embodiment. The minimum duty cycle is limited by the energy required to maintain the plasma and depends upon a variety of parameters including the chamber pressure, amplitude of the pulses, number of turns in the induction coil, and frequency of the RF power. The RF pulses in the high power cycles 306 preferably have a magnitude of less than about 10 kilowatts. The average power provided to the plasma is less than or equal to about 2 kilowatts. In alternate configurations, the amplitude and duty cycle should be selected to provide a desired average power (which typically ranges from 200 watts to 2 kilowatts).

The duration of the low power cycle ranges from about 50 to 500 microseconds. The maximum duration is typically limited due to the power required to sustain the discharge. If some power is applied during the low power cycles, their duration may be increased. In addition, when higher amplitudes are used during the high power cycles, the duration of the low power cycles may be slightly increased. The density of the plasma typically decreases during the low power cycles with a time constant on the order of 0.1 to 1 millisecond, so the ion density typically does not decrease excessively during the low power cycles.

In an exemplary embodiment, the high power cycle duration is 100 µs and the low power cycle duration is 600 µs. During the high power cycles, a 13.56 MHz signal with a magnitude of 5 kw is applied to the induction coils 124.

Figure 4:
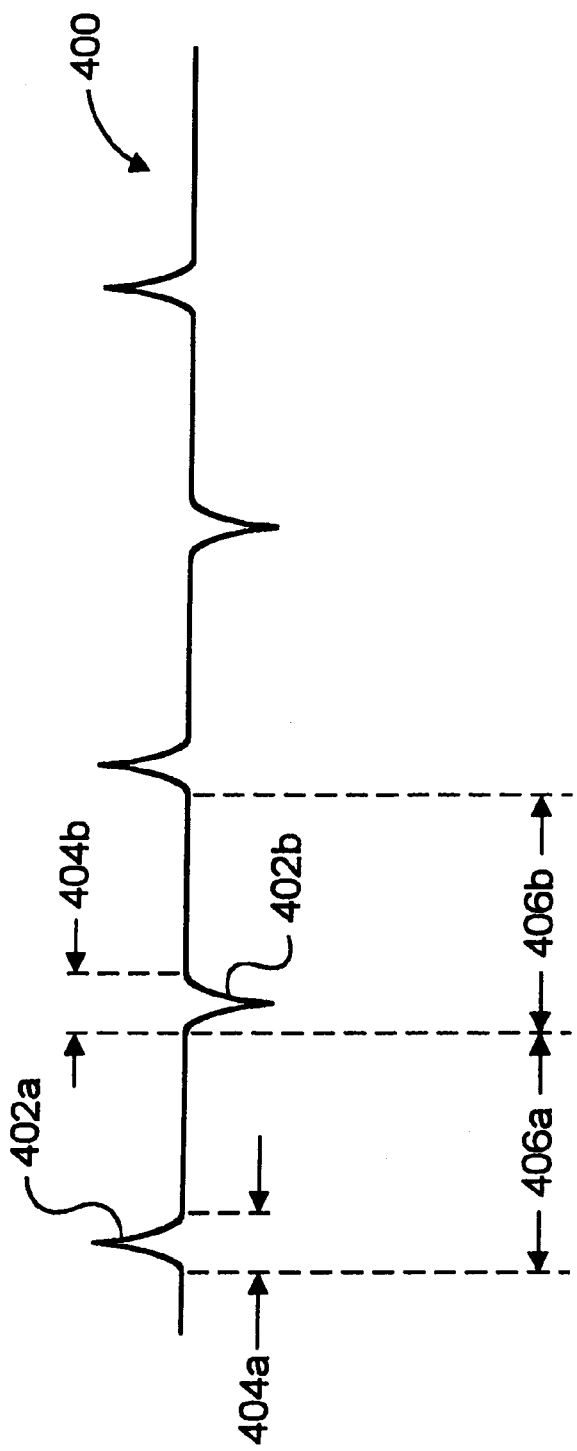
FIG. 4 shows an alternative power signal that may be applied to an induction coil in the wafer processing system according to the first embodiment.

FIG. 4 shows an alternative power signal waveform 400 that may be applied to the induction coils 124 in system 100. As with signal 300, signal 400 uses high and low power cycles to produce a plasma in the plasma generation chamber. Rather than using multiple high frequency sinusoidal pulses during the high power cycle as in FIG. 3, signal 400 uses a single pulse during each high power cycle as indicated at 402a and 402b in FIG. 4. Each pulse applies a time varying current to the induction coils 124 which inductively couples power into the plasma. As shown in FIG. 4, both positive pulses 402a and negative pulses 402b may be used. The amplitude, frequency and duration of the pulses may be varied to achieve desired plasma properties. The amplitude of each pulse typically ranges from 1 kV to 20 kV, the frequency typically ranges from 1 kHz to 10 kHz, and the duration of the pulses typically ranges from 50 µs to 500 µs. The duty cycle is determined by dividing the duration of the high power cycle (indicated at 404a) by the total period (indicated at 406a). The duty cycle of the high power cycle typically ranges from 5% to 30%. In the system of the second embodiment, the pulses preferably have an amplitude of about 5 kw, a frequency of 2 kHz, and a duration of 70 µs. This provides a duty cycle of 14%. During the remaining portion of period 406, no power (or low power) is coupled into the plasma.

Figure 5:
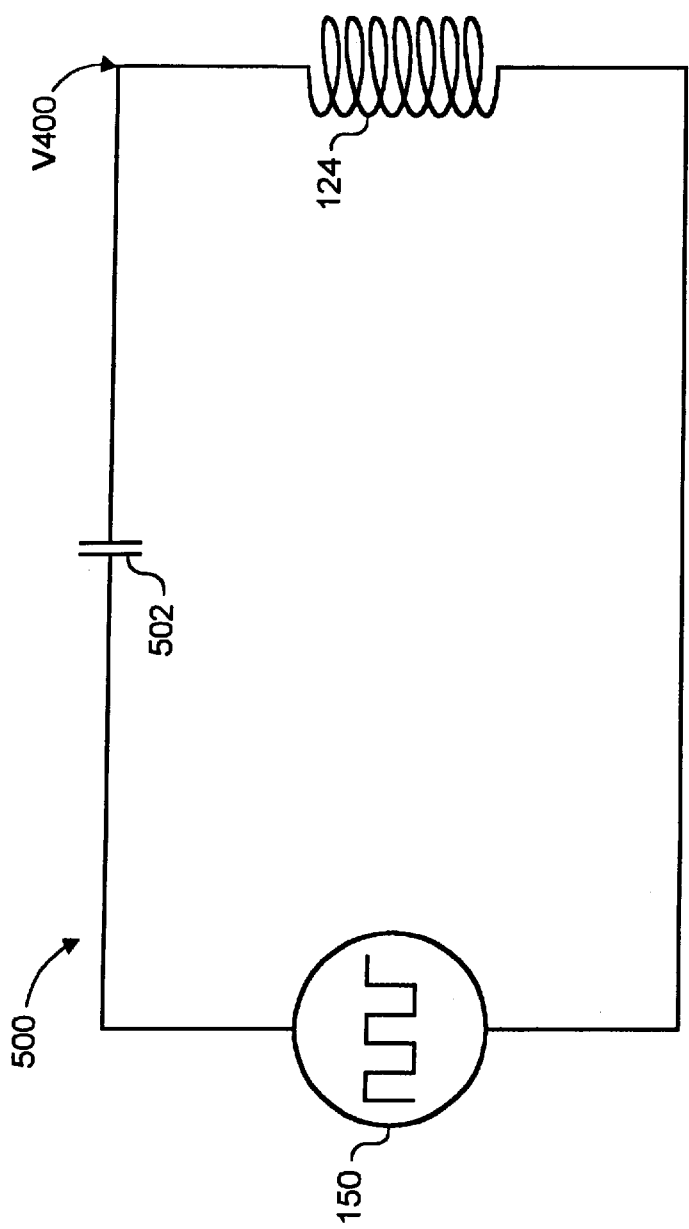
FIG. 5 is a schematic diagram illustrating an exemplary circuit that may be used to generate the power signal of FIG. 4.

FIG. 5 is a schematic of an exemplary of circuit 500 that may be used to generate signal 400. Referring to FIG. 5, signal 400 is generated by feeding a square wave from a conventional switching power supply 150 through a blocking capacitor 502. Signal 400 is applied to the induction coils 124 at node $V_{400}$.

The rise time of pulse 402a and the fall time of pulse 402b are determined by the amplitude of the square wave and the inductance and resistance of the induction coils 124 (which determine the RL time constant). The fall time of pulse 402a and the rise time of pulse 402b are determined by the amplitude of the square wave and the capacitance of blocking capacitor 502 and resistance of the induction coils 124 (which determine the RC time constant). The rise and fall times of the pulses determine the overall duration of the high power cycle. As will be readily apparent to one of ordinary skill in the art, the amplitude and frequency of the square wave determine the amplitude and frequency of the pulses.

While two exemplary power signal waveforms 300 and 400 have been described, any number of signals may be used in conjunction with embodiments of the present invention. What is desired is a high power cycle that sustains a plasma discharge with sufficient ion density for the desired etch rate, and a low power cycle that allows electrons to cool without reducing the ion density below the level desired for etching.

Using pulsed power to generate the plasma in the first embodiment helps decrease problems associated with charge buildup. The low power cycles allow electrons to cool, so fewer electrons are initially able to overcome the sheath potential and accumulate causing charge up on wafer surfaces. In addition, the sheath potential decreases during the low power cycles which allows the plasma to expand close to the wafer surface. The sheath potential is typically 3 to 5 times the plasma electron temperature divided by the charge of an electron. During low power cycles, the sheath potential may decrease to much less than a volt. The smaller sheath potential decreases the thickness of the sheath and reduces electric fields near the wafer allowing electrons closer to the wafer surface. As a result, the plasma is better able to neutralize charge that accumulates in various parts of the wafer surface.

Despite the low frequency power cycles, the system of the first embodiment achieves commercially viable etch rates. While the average power applied to the plasma is about one to two kilowatts, during high power cycles about 5–20 kilowatts may be applied to the plasma. During the high power cycles, a sufficient number of ions are generated for acceptable etch rates. The low power cycles are preferably not too much greater than the electron/ion, or negative ion-positive ion recombination time constant, so the ion density is not excessively reduced during these cycles. The low power cycles may also facilitate the formation of negative ions. During the low power cycles, electrons reach lower energy levels. At low thermal energy, electrons may combine with neutral atoms or molecules to form negative ions. As will be described below, these negative ions may be used in some embodiments to reduce charge buildup or etch the substrate.

Figure 8:
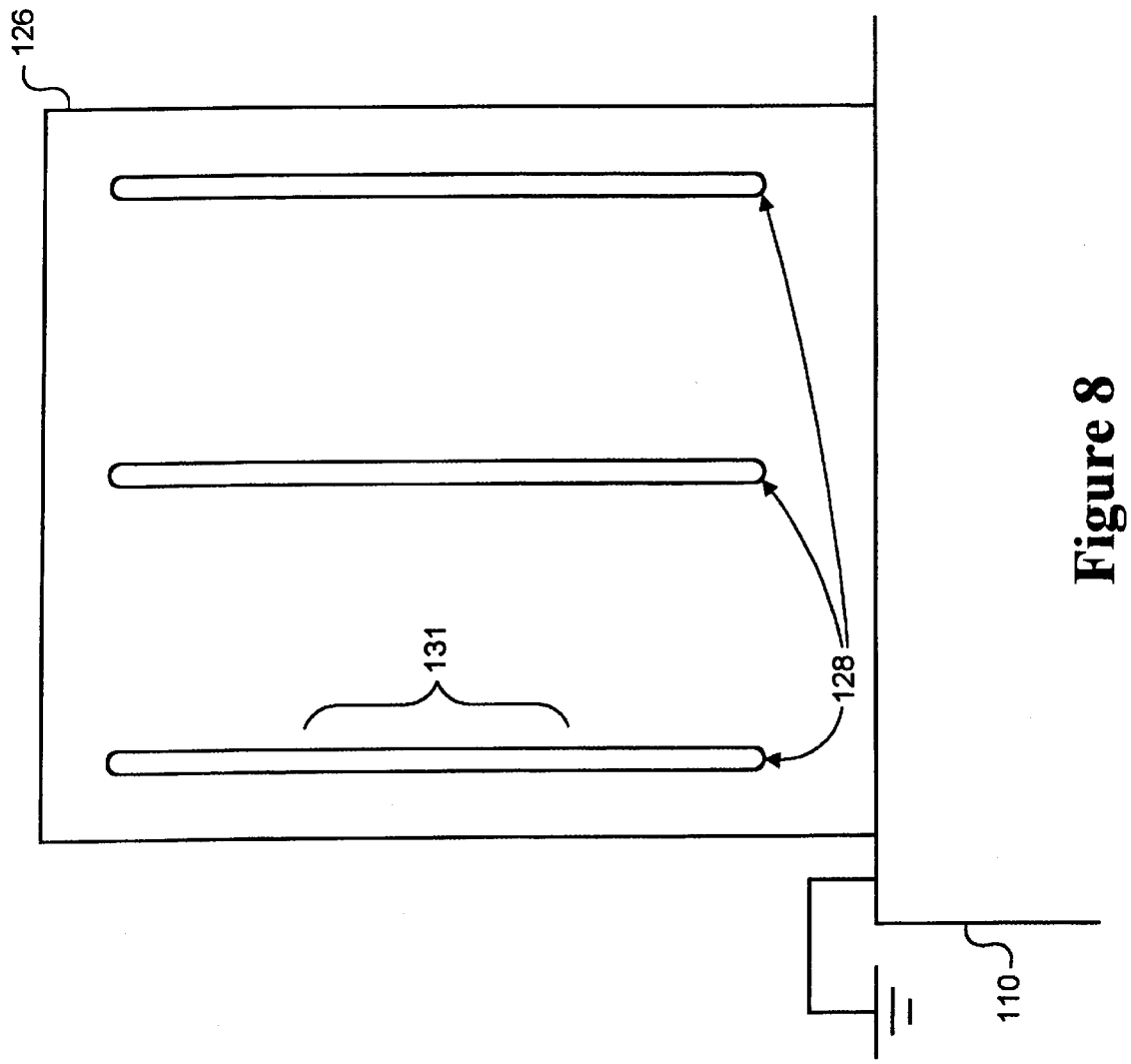
FIG. 8 is a side view of a split Faraday shield that may be used in the system according to the first embodiment.

When high frequency power is applied to the induction coil (as described above with reference to FIG. 3), significant power may be capacitively coupled into the plasma in addition to the inductively coupled plasma. See U.S. patent application Ser. No. 07/460,707 filed Jan. 4, 1990, which is hereby incorporated by reference. See also U.S. patent application Ser. No. 08/340,696 filed Nov. 15, 1994, which is hereby incorporated by reference. The capacitively coupled power modulates the plasma potential relative to the wafers. At the power levels used to produce a dense plasma, the plasma modulation may cause higher energy ion bombardment and degrade the process or damage some exposed layers on the wafer. As shown in FIG. 1, a split Faraday shield 126 may be interposed between the induction coil and the plasma to reduce capacitive coupling between the coil and the plasma. FIG. 8 illustrates the structure of the split Faraday shield 126 that is used in the first embodiment when high frequency power is applied to the induction coils 124. The shield 126 has vertical slots 128 that start approximately near the top of the plasma generation chambers 102 and end near the top of the processing chamber 108. This allows the shield 126 to be an integral part which simply fits over the plasma reactor chamber. The bottom of the shield 126 may be connected to the top of the processing chamber to provide a common ground for the shield 126.

In the first embodiment, the split Faraday shield is designed to allow some modulation of the plasma potential. This design makes it easier to ignite and maintain a plasma reaction in the plasma generation chambers. Nevertheless, the split Faraday shield blocks substantial capacitive coupling and limits modulation of the plasma potential to a desired amount (order of magnitude <10 volts). The number and width of slots in the split Faraday shield may be selected to control the level of capacitive coupling and modulation. The slots 128 in the shield 126 are typically about 3/16 to 3/8 wide. The induction coil 124 surrounds the split Faraday shield around the middle portion 131 of the slots. For the split Faraday shield of the first embodiment, there are 8 slots with adjacent slots being separated by a distance of about 8.4 cm from center to center.

Figure 6:
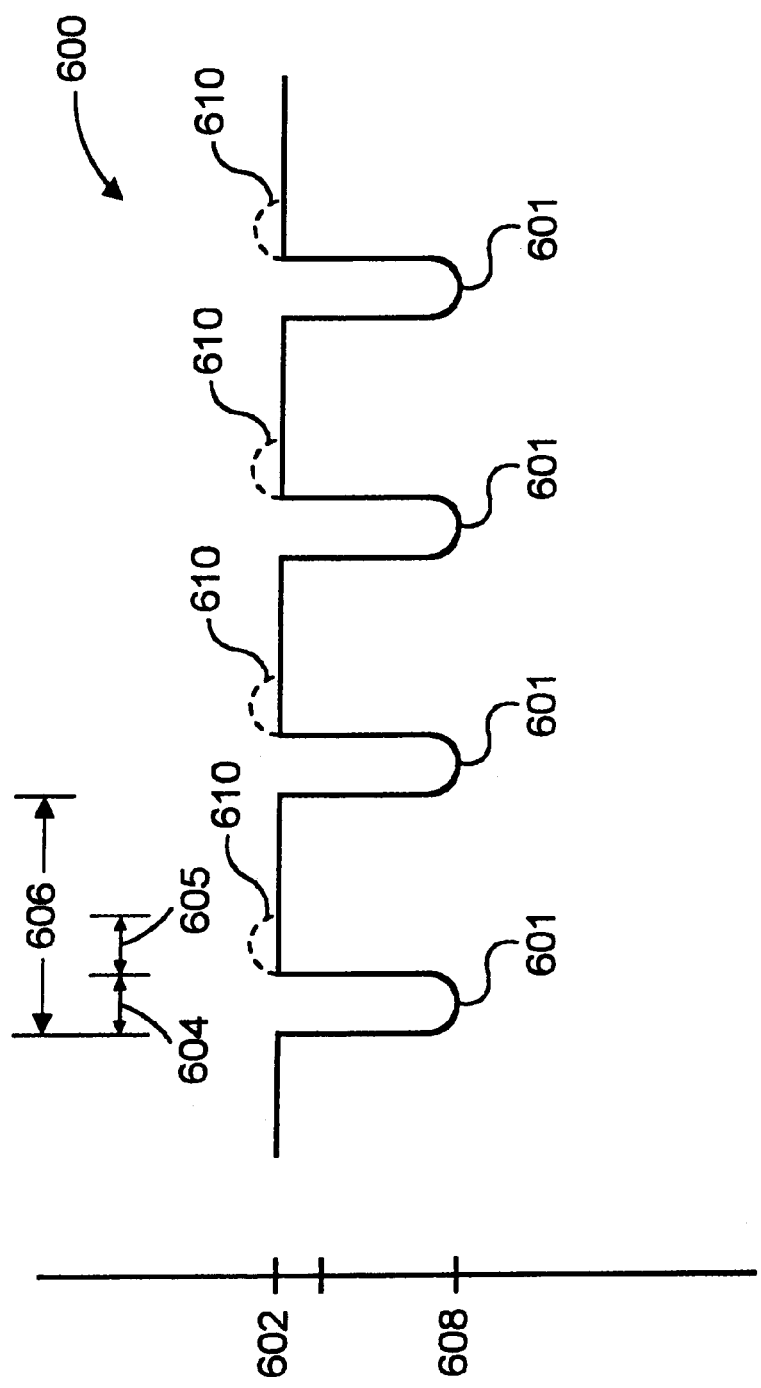
FIG. 6 shows a power signal that may be used to control ion bombardment in the system according to the first embodiment.

A second power source 152 is coupled to electrode 112 to accelerate ions toward wafers 107 for anisotropic etching. The power applied to the electrode alternates between high and low power cycles. FIG. 6 shows an exemplary power signal waveform 600 that may be applied to the electrode in the first embodiment. A strong negative bias is applied to the substrate in short pulses 601. Preferably, multiple pulses occur during the average transit time for an ion to cross the plasma sheath and reach the wafer surface. A typical ion transit time is estimated to be about 1 microsecond, and the pulse duration 604 in the first embodiment typically ranges from about 0.03 to 0.3 microseconds. In the first embodiment, the pulses 601 have a frequency in the range of about 1 to 5 MHz. Alternative embodiments may use frequencies ranging from about 500 kHz to 20 MHz.

Each pulse 601 is followed by a low power cycle during which a low voltage of opposite sign bias is applied to the electrode such that the time average voltage is nearly zero.

In the first embodiment, the duty cycle of the pulses, as determined by the pulse duration 604 divided by the total period 606 (i.e., the combined duration of a high and low power cycle), is typically in the range of about 10 to 20 percent. Alternative embodiments may use duty cycles ranging from about 5 percent to 50 percent. The duty cycle that is used with a particular embodiment will depend on a number of factors, including the desired etch characteristics (rate, sidewall profile, selectivity), the acceptable ion bombardment energies, the amplitude of the pulses, and other plasma characteristics such as density and plasma potential.

Signal 600 has a DC offset 602 on the order of one to two tenths of the absolute value of the amplitude of the negative pulses 601. The amplitude 608 of the pulses 601 is preferably in the range of about negative 100 to negative 300 volts. Alternate embodiments may use pulses having amplitudes in the range of from about negative 10 volts to negative several thousand volts. The average ion bombardment energy in the present embodiment, with three to five megapulses per second, 10 percent duty cycle, and an amplitude between −100 and −200 volts is about 10 to 20 electron volts. This average ion bombardment energy (in combination with the low electron temperature and plasma potential) provides a low ion energy etch even though the pulses have large amplitudes.

The alternating bias accelerates ions toward the wafers in pulsed waves. During the high power negative pulses, positive ions accelerate toward the wafers. Some ions are pulsed near the wafer surface without reaching it. During the low power cycles, these ions drift at constant velocity. Some may exchange charge with other particles or make large angle collisions. Ions flowing to the surface help neutralize any negative charge that has accumulated on elevated wafer surfaces. During the next pulse, the remaining ions near the wafer surface are accelerated toward the wafer for anisotropic etching. These ions are not deflected into sidewalls as readily as ions in conventional low energy etch processes due to reduced charge buildup, the relatively low duty cycle of the pulses used to accelerate ions toward the wafer, and the low plasma potential.

The low power cycles may also reduce charge buildup by reducing the electron kinetic energy and hence the accumulated charge on exposed surfaces. In particular, the plasma can charge up the wafer surface to a voltage proportional to the electron temperature during periods when the inductively coupled power is in its low power cycle.

A variety of alternative signals may be used to provide a pulsed bias on electrode 112. For instance, a slightly positive DC bias of several volts may be used during the low bias power cycles to attract negative charge to neutralize the positive charge that has accumulated in the depths of recessed wafer features. Alternatively, a short low power positive pulse 610 may be applied to the electrode after each high power negative pulse. The positive pulses would last for only a small portion of the low power cycle to attract negative charge which builds up on recessed features of the wafer. Any positive charges would also be briefly repelled with minimal effect on ion motion. During the unbiased portion of the low power cycle, any remaining charge would be neutralized. An amplitude of less than about 10 volts and a duration about equal to the duration of pulses 601 may be used for these positive pulses in the first embodiment.

In the first embodiment, the power from the second power source is applied to the electrode 112 using a very low inductance and stray capacitance conductor. This low impedance connection causes signal pulses to be undiminished by the transmission between the electrode 112 and source. This low impedance connection may be important to ensure that the signal pulses produce the desired bias on the electrode.

An alternate embodiment may be configured to use negative ions as well as positive ions for etching. Negative ions tend to be formed when electrons in the plasma have low average energies. The electrons tend to recombine with neutral atoms and molecules which are more abundant in the plasma than positive ions. A low (or zero) power should be applied to the induction coils during the low power part of the cycle to promote the formation of negative ions. Positive and negative ions may be used for etching by applying both negative and positive biases to the wafer. If the plasma potential is too high, however, the negative ion density will be too low to contribute significantly to etching.

Figure 7:
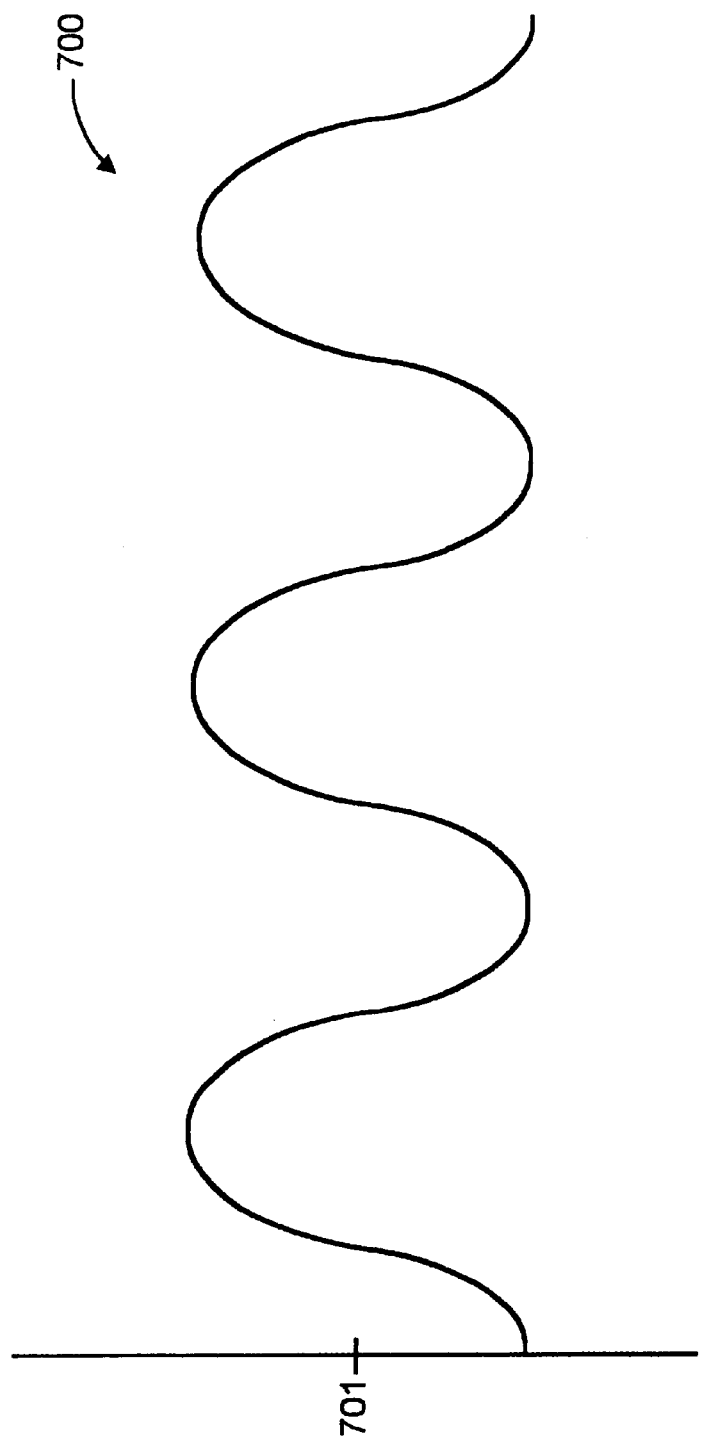
FIG. 7 shows an alternate power signal that may be used to control ion bombardment in the system according to the first embodiment.

When the inductively coupled power is adjusted to produce a plasma with a large number of negative ions, a lower frequency sinusoidal power signal may be applied to electrode 112 to alternatively accelerate positive and negative ions toward the wafer surface. FIG. 7 shows an exemplary signal 700. As shown in FIG. 7, signal 700 has both positive and negative portions relative to DC offset 701 (which is preferably zero). Positive ions will be accelerated toward the wafer during portions of the signal having a negative voltage, and negative ions will be accelerated toward the wafer during portions of the signal having a positive voltage. Thus, both positive and negative ions may be used for etching. Signal 700 has a frequency of about 50 kHz to 1 MHz, although other frequencies may be used as well. The signal does not have to be symmetric about DC offset 701 It may be desirable to have a longer negative bias with a larger amplitude if there are more positive ions available for etching. A self-bias develops in this case. In addition, the negative and positive pulses may be separated by a period having no bias to allow charge to neutralize on the wafer surface. Alternatively, a square or triangular power signal waveform with both negative and positive portions may be used to accelerate positive and negative ions for etching.

While this invention has been described and illustrated with reference to particular embodiments, it will be readily apparent to those skilled in the art that the scope of the present invention is not limited to the disclosed embodiments but, on the contrary, is intended to cover numerous other modifications and equivalent arrangements which are included within the spirit and scope of the following claims.

What is claimed is:

1. A plasma processing system for processing a semiconductor substrate, the a system comprising:
   a processing chamber for producing the plasma;
   an induction coil surrounding at least a portion of the processing chamber;
   a first pulse power source coupled to the induction coil such that the induction coil couple power into the plasma using both high power cycles and low power cycles;
   a substrate support for supporting the substrate the substrate support being positioned adjacent to the plasma; and
   a second pulse power source coupled to the substrate support for applying a bias to the substrate;
   wherein the second pulse power source is configured to alternate between high and low power cycles with a frequency ranging from about 500 kHz to 60 MHz.

2. The plasma reactor of claim 1 wherein the plasma has a potential and an ion density, the potential of the plasma is substantially larger during the high power cycles than during the low power cycles, and the ion density of the plasma during the high power cycles is within an order of magnitude of the ion density of the plasma during the low power cycles.

3. The processing chamber of claim 1, wherein the first pulse power source is configured such that the high and low power cycles of the inductively coupled power produce and sustain a plasma discharge.

4. The processing chamber of claim 3, wherein the first pulse power source is configured such that the high power cycles produce a high density of ions for etching, and the low power cycles reduce the average electron thermal velocity in the plasma.

5. The processing chamber of claim 4, wherein the first pulse power source is configured such that during the low power cycles, fewer electrons overcome the plasma sheath to accumulate on insulated surfaces of the substrate than would have accumulated without low power cycles.

6. The processing chamber of claim 1, wherein the first pulse power source is configured such that the duration of the high power cycles ranges from about 5 to 100 microseconds.

7. The processing chamber of claim 1, wherein the first pulse power source is configured such that the duration of the low power cycles ranges from about 30 to 1000 microseconds.

8. The processing chamber of claim 1, wherein the first pulse power source is configured such that the duration of the high power cycles is less than or equal to the duration of the low power cycles.

9. The processing chamber of claim 1, wherein the first pulse power source is configured such that the duty cycle of the high power cycles ranges from about 5 to 30 percent.

10. The processing chamber of claim 1, wherein the first pulse power source is configured such that the duty cycle of the high power cycles is about 10 percent.

11. The processing chamber of claim 1, wherein the first pulse power source is configured such that the magnitude of the high power cycles is less than about 10 kilowatts.

12. The processing chamber of claim 1, wherein the first pulse power source is configured such that the average power of the high power cycles ranges from about 200 watts to 2 kilowatts.

13. The processing chamber of claim 1, wherein the first pulse power source is configured such that the power of the low power cycles is at least 10 to 100 times less than the power of the high power cycles.

14. The processing chamber of claim 1, wherein the first pulse power source is configured such that the frequency of the inductively coupled power ranges from about 2 kHz to 40.68 MHz.

15. The processing chamber of claim 1, wherein the first pulse power source is configured such that the frequency of the inductively coupled power is 13.56 MHz.

16. The processing chamber of claim 1, wherein the second pulse power source is configured such that ions are accelerated toward the substrate only when high power cycles are being applied to the substrate support.

17. The processing chamber of claim 1, wherein the second pulse power source is configured such that during the low power cycles, ions retain their anisotropic motion toward the substrate.

18. The processing chamber of claim 1, wherein the second pulse power source is configured such that the frequency of alternating between high and low power cycles is such that at least two negative voltage pulses of high power cycles are applied to the substrate support during the average transit time for an ion to cross a plasma sheath.

19. The processing chamber of claim 18, wherein the second pulse power source is configured such that the duration of each negative voltage pulse of high power cycles ranges from about 1 to 10 percent of the average transit time for an ion to cross the plasma sheath.

20. The processing chamber of claim 19, wherein the second pulse power source is configured such that the duration of each negative voltage pulse of high power cycles ranges from about 0.02 to 0.2 microseconds.

21. The processing chamber of claim 1, wherein the second pulse power source is further configured such that the second pulse power source alternates between high and low power cycles with a frequency ranging from about 1 to about 5 MHz.

22. The processing chamber of claim 1, wherein the second pulse power source is configured such that the duty cycle of the high power cycles ranges from about 5 to 50 percent.

23. The processing chamber of claim 22, wherein the second pulse power source is configured such that the duty cycle of the high power cycles ranges from about 10 to 20 percent.

24. The processing chamber of claim 1, wherein the second. power source is configured such that the high power cycles comprises a DC signal.

25. The processing chamber of claim 24, wherein the second pulse power source is configured such that the amplitude of the DC signal ranges from about negative 100 to about negative 300 volts.

26. The processing chamber of claim 1, wherein the substrate support comprises an electrode for supporting and biasing the substrate.

* * * * *